United States Patent
Marakhtanov et al.

(10) Patent No.: US 6,972,524 B1
(45) Date of Patent: Dec. 6, 2005

(54) PLASMA PROCESSING SYSTEM CONTROL

(75) Inventors: Alexei M. Marakhtanov, Albany, CA (US); Eric Allen Hudson, Berkeley, CA (US); S. M. Reza Sadjadi, Saratoga, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 10/808,795

(22) Filed: Mar. 24, 2004

(51) Int. Cl.$^7$ .............................................. H05H 1/00
(52) U.S. Cl. ........................ 315/111.21; 118/723 MR; 156/345.48
(58) Field of Search ...................... 315/111.31, 111.21; 118/723 I, 723 R, 723 ME, 723 MR; 156/345.48, 156/345.49

(56) References Cited

U.S. PATENT DOCUMENTS

| | | | |
|---|---|---|---|
| 5,933,314 A | | 8/1999 | Lambson et al. |
| 6,488,807 B1 * | | 12/2002 | Collins et al. ......... 156/345.49 |
| 6,885,153 B2 * | | 4/2005 | Quon .................... 315/111.31 |

OTHER PUBLICATIONS

Kawamura et al., "Ion energy distributions in RF sheaths; review, analysis and simulation", 1999, Plasma Sources Science Technology 8, R45-R64.

Lieberman et al., "Principles of Plasma Discharges and Materials Processing", 1994, New York, John Wiley and Sons, Inc.

* cited by examiner

Primary Examiner—David Vu
(74) Attorney, Agent, or Firm—IP Strategy Group, PC

(57) ABSTRACT

A method of approximating an ion energy distribution function (IEDF) at a substrate surface of a substrate, the substrate being processed in a plasma processing chamber. There is included providing a first voltage value, the first voltage value representing a value of a first voltage that represents a DC potential ($V_{DC}$) at the substrate surface. There is also included providing a peak low frequency RF voltage value ($V_{LFRF(PEAK)}$) during plasma processing, the peak low frequency RF voltage ($V_{LFRF(PEAK)}$) value representing a peak value of a low frequency RF voltage ($V_{LFRF}$) supplied to the plasma processing chamber. There is further included providing a computing device configured to compute the IEDF from the first voltage value and the peak low frequency RF voltage value ($V_{LFRF(PEAK)}$) in accordance with $$f(E) \equiv \left(\frac{dV_{LF}}{dt}\right)^{-1},$$

wherein $$V_{LF}(t) = \left[\left(\frac{V_{LFRF(PEAK)} - V_{dc}}{2}\right)^{1/2} - \left(\frac{V_{LFRF(PEAK)} - V_{dc}}{8}\right)^{1/2} \sin\omega t\right]^2.$$

41 Claims, 4 Drawing Sheets

PLASMA PROCESSING SYSTEM CONTROL

BACKGROUND OF THE INVENTION

The present invention relates to plasma processing of semiconductor substrates. More particularly, the present invention relates to methods and apparatus for process control during the processing of semiconductor substrates.

In the processing of semiconductor substrates (semiconductor wafers, substrates for Integrated circuit (IC) microelectronics or Micro-electromechanical Systems), it is important to maintain control over the process parameters. Exemplary process parameters include the RF voltage, RF current, the amount of time the process runs, the type and volume of etch and source gas employed, and the like. Over time, it has been found that when a substrate is processed in a plasma processing chamber, ion energy at the substrate surface is an important parameter that may affect many process results such as selectivity, etch rate and/or deposition rate, etch profile, and the like.

To facilitate discussion, FIG. 1 shows an exemplary plasma processing system 102, which in the example of FIG. 1 is a capacitively coupled plasma processing system. Plasma processing system includes a chamber (not shown) within which there are disposed two electrodes, an upper electrode 104 and a lower electrode 106. One or both of upper electrode 104 and lower electrode 106 may be energized by one or more RF power source.

With reference to FIG. 2, upper electrode 104 is grounded while the lower electrode 106 is coupled to two RF generators: a high frequency RF generator 108, and a lower frequency RF generator 110. These RF generators are coupled to lower electrode 106 via a matching network 112. Lower electrode 106 implements a bi-polar electrostatic chuck (ESC) 120, which is configured to hold a substrate 122 in position during plasma processing.

During processing, a plasma 124 is ignited from the etchant source gas by the RF energy supplied by high frequency RF generator 108 and lower frequency RF generator 110. Between plasma 124 and the upper surface of substrate 122, there exists a plasma sheath in the region 126. Ion species from plasma 124 gains energy as they cross the plasma sheath prior to impacting on the surface of substrate 122. Process engineers have long been interested in accurately determining the ion energy at the substrate surface in order to fine-tune the process recipe and/or to monitor process accuracy during production.

One way to measure the ion energy at the substrate surface is to employ an ion-energy analyzer to collect ions at the substrate surface. However, an ion-energy analyzer is an expensive piece of equipment and is relatively bulky to employ in the plasma processing environment. Furthermore, the presence of an ion-energy analyzer collector in the vicinity of a highly energized electrode necessitates complex and expensive techniques for electrically isolating the ion-energy analyzer collector from the electrodes. For this reason, the use of an ion-energy analyzer to determine ion energy during plasma substrate processing has not been widely adopted.

SUMMARY OF INVENTION

The invention relates, in an embodiment, to a method of approximating an ion energy distribution function (IEDF) at a substrate surface of a substrate, the substrate being processed in a plasma processing chamber. There is included providing a first voltage value, the first voltage value representing a value of a first voltage that represents a DC potential ($V_{DC}$) at the substrate surface. There is also included providing a peak low frequency RF ($V_{LFRF(PEAK)}$) value representing a peak value of a low frequency RF voltage ($V_{LFRF}$) supplied to the plasma processing chamber. There is further included providing a computing device configured to compute the IEDF from the first voltage value and the peak low frequency RF voltage value ($V_{LFRF(PEAK)}$) in accordance with $$f(E) \equiv \left(\frac{dV_{LF}}{dt}\right)^{-1},$$

wherein $$V_{LF}(t) = \left[\left(\frac{V_{LFRF(PEAK)} - V_{dc}}{2}\right)^{1/2} - \left(\frac{V_{LFRF(PEAK)} - V_{dc}}{8}\right)^{1/2} \sin\omega t\right]^2.$$

In another embodiment, the invention relates to a method of controlling plasma processing in a plasma processing chamber, the plasma processing being configured to process a substrate while the substrate is disposed on a chuck of the plasma processing chamber. There is included providing a first voltage value, the first voltage value representing a value of a first voltage that represents a DC potential ($V_{DC}$) at the substrate surface during plasma processing. There is further included providing a peak low frequency RF voltage value ($V_{LFRF(PEAK)}$) during plasma processing, the peak low frequency RF voltage ($V_{LFRF(PEAK)}$) value representing a peak value of a low frequency RF voltage ($V_{LFRF}$) supplied to the chuck. Additionally, there is included providing a computing device configured for computing the IEDF from the first voltage value and the peak low frequency RF voltage value ($V_{LFRF(PEAK)}$) in accordance with $$f(E) \equiv \left(\frac{dV_{LF}}{dt}\right)^{-1},$$

wherein $$V_{LF}(t) = \left[\left(\frac{V_{LFRF(PEAK)} - V_{dc}}{2}\right)^{1/2} - \left(\frac{V_{LFRF(PEAK)} - V_{dc}}{8}\right)^{1/2} \sin\omega t\right]^2$$

Furthermore, there is included modifying at least one process parameter associated with a process recipe employed during the plasma processing responsive to a value of the IEDF.

In yet another embodiment, the invention relates to an arrangement for approximating an ion energy distribution function (IEDF) at a substrate surface of a substrate, the substrate being processed in a plasma processing chamber. There is included a first circuit for obtaining a first voltage value, the first voltage value representing a value of a first voltage that represents a DC potential ($V_{DC}$) at the substrate surface. There is also included a second circuit for obtaining a peak low frequency RF voltage value ($V_{LFRF(PEAK)}$) during plasma processing, the peak low frequency RF voltage ($V_{LFRF(PEAK)}$) value representing a peak value of a low frequency RF voltage ($V_{LFRF}$) supplied to the plasma processing chamber. Additionally, there is included a computing device configured to compute the IEDF from the first voltage value and the peak low frequency RF voltage ($V_{LFRF(PEAK)}$) in accordance with $$f(E) \equiv \left(\frac{dV_{LF}}{dt}\right)^{-1},$$

wherein $$V_{LF}(t) = \left[\left(\frac{V_{LFRF(PEAK)} - V_{dc}}{2}\right)^{1/2} - \left(\frac{V_{LFRF(PEAK)} - V_{dc}}{8}\right)^{1/2} \sin\omega t\right]^2$$

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one embodiment, there are provided improved methods and apparatus for accurately approximating the ion energy distribution function (IEDF) at the substrate surface using two readily available parameters: the DC potential at the substrate ($V_{DC}$) and the peak low frequency RF voltage ($V_{LFRF(PEAK)}$).

Figure 1:
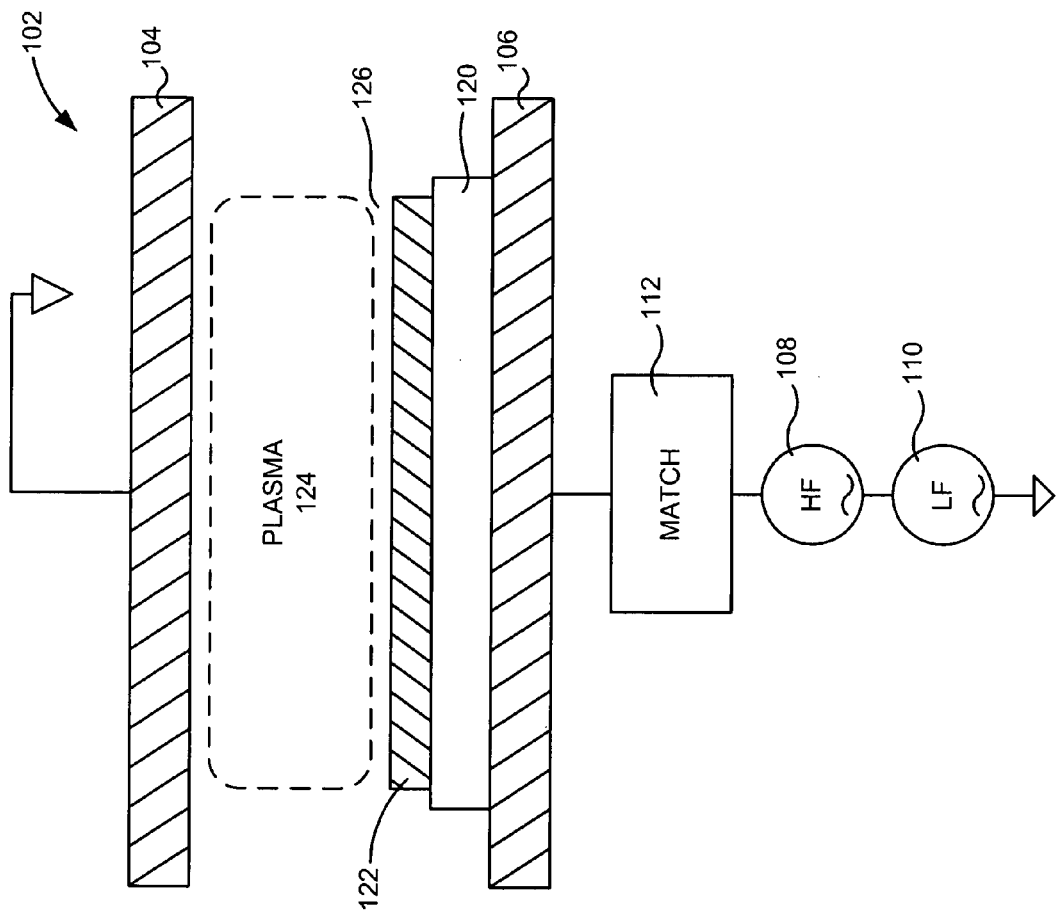
FIG. 1 shows an exemplary plasma processing system to facilitate discussion.
Figure 2:
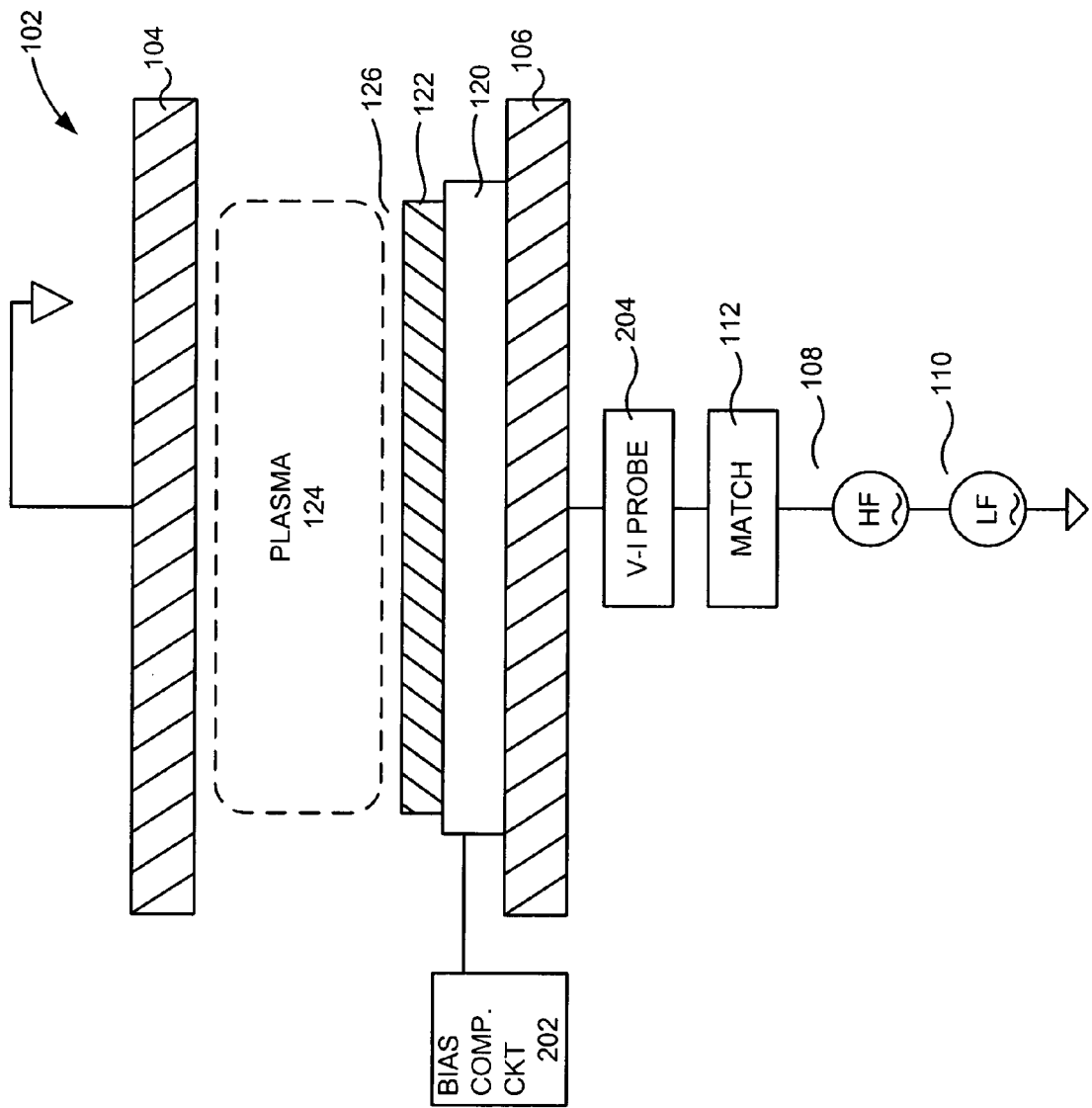
FIG. 2 shows an exemplary plasma processing system for practicing an embodiment of the present invention. In the plasma processing system of FIG. 2, the upper electrode is grounded while the lower electrode is coupled to two RF generators: a high frequency RF generator, and a lower frequency RF generator.

In one embodiment, the bias compensation voltage for the bi-polar electrostatic chuck is employed as the VDC value and the $V_{LFRF(PEAK)}$ may be measured directly using a V-I probe inserted between the powered electrode and the match network. With reference to FIG. 2, the bias compensation voltage $V_{DC}$ may be obtained from the bias compensation circuit 202 and V-I probe 204 provides the peak low frequency RF voltage. Further information regarding an example of a bias compensation circuit may be found in publicly available literature, including for example U.S. Pat. No. 5,933,314 "Method And An Apparatus For Offsetting Plasma Bias Voltage In Bi-Polar Electro-Static Chucks".

A necessary condition is the use of the low frequency such that ions cross the plasma sheath in a small fraction of an RF cycle. Discussions regarding the effects of low frequency RF signals on ions may be found in existing literature, including for example, E. Kawamura, V. Vahedi, M. A. Lieberman, and C. K. Birdsall, Plasma Sources Sci. Technol. 8 (1999) R45–R64).

Once the DC potential at the substrate $V_{DC}$ and the peak low frequency RF voltage $V_{LFRF(PEAK)}$ are obtained, the low frequency sheath voltage $V_{LF}(t)$ may be found in accordance with Equation 1.

$$V_{LF}(t) = \left[\left(\frac{V_{LFRF(PEAK)} - V_{dc}}{2}\right)^{1/2} - \left(\frac{V_{LFRF(PEAK)} - V_{dc}}{8}\right)^{1/2} \sin\omega t\right]^2 \quad \text{[Equation 1]}$$

Furthermore, the IEDF at the substrate surface can be found from Equation 2.

$$f(E) \equiv \left(\frac{dV_{LF}}{dt}\right)^{-1} \quad \text{[Equation 2]}$$

The derivation of the low frequency sheath voltage and the IEDF from the DC potential at the substrate $V_{DC}$ and the peak low frequency RF voltage $V_{LFRF(PEAK)}$ represent components of one embodiment of the invention and will be discussed in detail later herein.

Generally speaking, both the DC potential at the substrate $V_{DC}$ and the peak low frequency RF voltage ($V_{LFRF(PEAK)}$) may be obtained, either continuously or may be sampled periodically, and may be provided to an appropriate computing device for calculating the IEDF.

Figure 3:
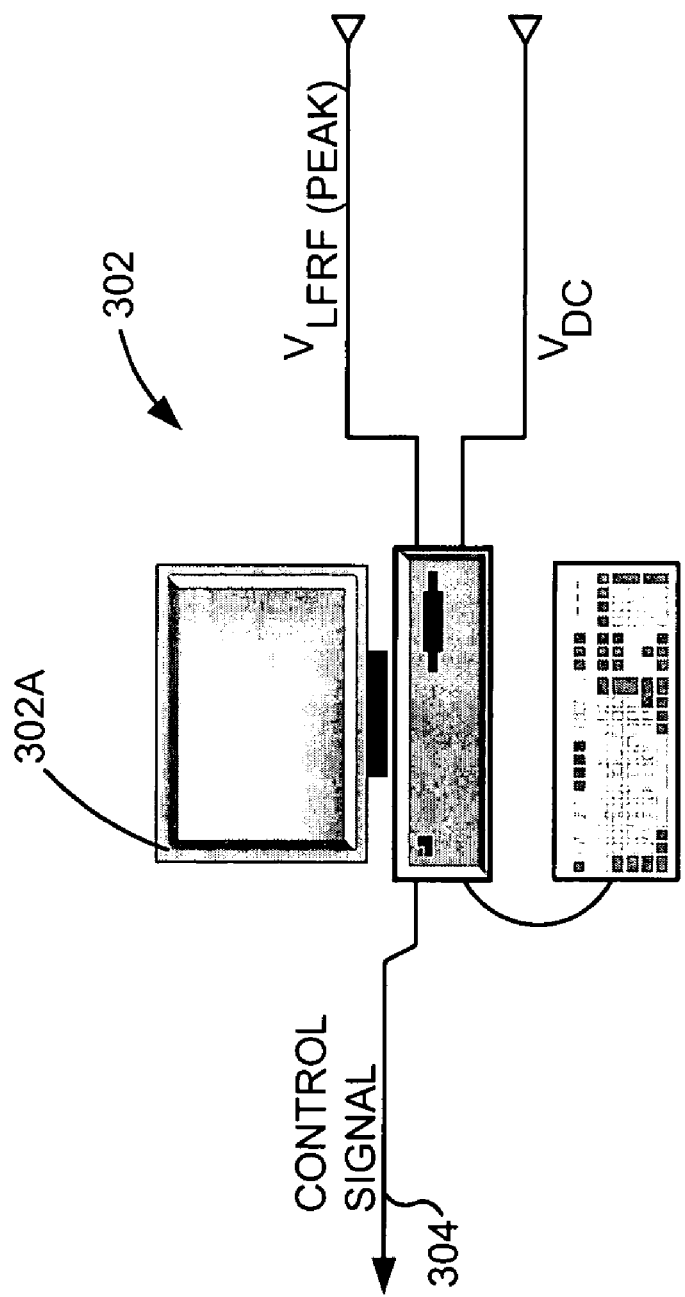
FIG. 3 shows, in accordance with an embodiment of the invention, an arrangement for computing the IEDF using a computing device that receives as inputs the DC potential at the substrate $V_{DC}$ and the peak low frequency RF voltage $V_{LFRF(PEAK)}$.

With reference to FIG. 3, this electronic circuit is represented by a computer 302 which receives as inputs the DC potential at the substrate $V_{DC}$ and the peak low frequency RF voltage $V_{LFRF(PEAK)}$ and computes, using a program executed within computing device 302, the ion energy value at the substrate surface. This ion energy value may then be employed to refine the process recipe under development or it may be employed as a quality control parameter during production.

For example, if the ion energy reaches a certain threshold, a control signal 304 may be generated in order to alert the process engineer that there is a problem with the plasma processing of the substrate and/or to cause the control computer to adjust process parameters to bring the ion energy level back into compliance. Alternatively or additionally, the computed ion energy may be displayed on display 302A of computer 302 to allow the process engineer to understand the changes to ion energy as other parameters of the recipe are varied.

Figure 5:
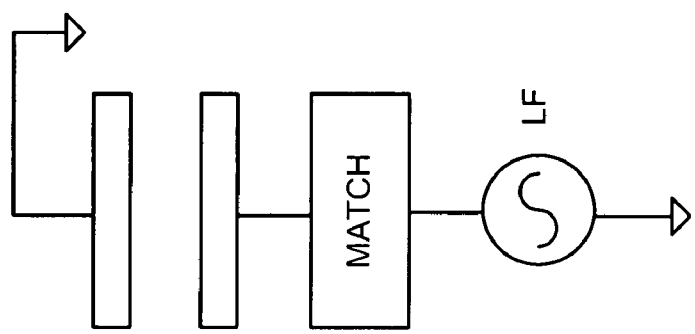
FIG. 5 shows an exemplary plasma processing system for practicing an embodiment of the present invention. In the plasma processing system of FIG. 5, there is only a single low frequency RF generator, which is coupled to the lower electrode.
Figure 4:
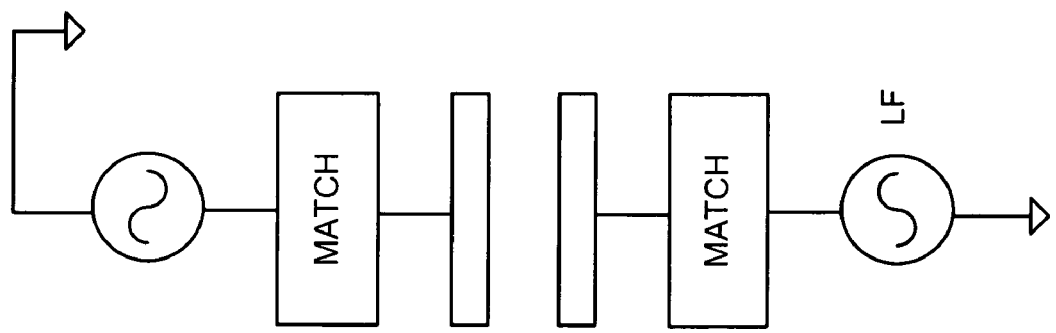
FIG. 4 shows an exemplary plasma processing system for practicing an embodiment of the present invention. In the plasma processing system of FIG. 4, there are a high frequency generator and a low frequency generator although only the low frequency RF generator is coupled to the lower electrode.

Although FIG. 2 shows a high frequency generator and a low frequency generator both applied to the lower electrode, it should be noted that the invention also applies to dual frequency capacitively coupled plasma processing systems where only the low frequency RF signal is applied to the lower electrode. This is shown in FIG. 4. Furthermore, the invention also applies to single frequency capacitively coupled plasma processing systems if the frequency meets the low frequency criteria. An exemplary single frequency capacitively coupled discharged plasma processing system is shown in FIG. 5, wherein the single low frequency signal is applied to the lower electrode. Furthermore, the invention may also apply if more than two RF frequencies are employed, as long as one of the frequencies plays the role of the low frequency applied to the substrate.

Computation of IEDF from DC Potential at the Substrate ($V_{DC}$) and Peak Low Frequency RF Voltage ($V_{LFRE}$).

As an example, consider the dual frequency plasma situation. The total RF current can be obtained as a sum of both the low frequency RF current and the high frequency RF current.

$$I_{rf}(t) = \tilde{I}_{LF} \cos\omega_{LF}t + \tilde{I}_{HF} \cos(\omega_{HF}t + \omega) \quad \text{[Equation 3]}$$

Where $\tilde{I}_{LF}$ and $\tilde{I}_{HF}$ are the RF amplitudes of the low and high frequency current, respectively. $\omega_{LF}$ and $\omega_{HF}$ represent the low frequency and high frequency respectively. $\omega$ is the phase shift between the high frequency RF current and the low frequency RF current.

According to reference 1 (M. A. Lieberman and A. J. Lichtenberg, Principles of Plasma Discharges and Materials Processing, New York, John Wiley, 1994) the plasma sheath thickness s(t) at the powered electrode is:

$$-enA_e \frac{d(t)}{dt} = I_{rf}(t). \quad \text{Equation 4}$$

where e is the charge of an electron, which is a constant, and n is the plasma density and $A_e$ is the electrode area. Integrating Equation 4 over time and using Equation 3 (and assume φ equal to zero), we arrive at Equation 5.

$$s(t) = \bar{s}_o - \frac{\tilde{I}_{LF}}{enA_e\omega_{LF}}\sin\omega_{LF}t - \frac{\tilde{I}_{HF}}{enA_e\omega_{HF}}\sin\omega_{HF}t \quad \text{[Equation 5]}$$

where $\bar{s}_o$ is a constant of integration.

From reference 1, the potential of the plasma with respect to the powered electrode can be found as $$V(t) = \frac{en}{2\varepsilon_o}s^2(t) \quad \text{[Equation 6]}$$

Neglecting the high frequency component and using Equation 5 for the sheath thickness s(t), the sheath potential at the powered electrode due to the low frequency RF signal is $$V_{LF}(t) = \frac{en}{2\varepsilon_o}\left[\bar{s}_o - \frac{\tilde{I}_{LF}}{enA_e\omega_{LF}}\sin\omega_{LF}t\right]^2 \quad \text{[Equation 7]}$$

In other words, the low frequency sheath potential $V_{LF}$ can be expressed as $$V_{LF}(t) = [A - B \sin \omega_{LF}t]^2 \quad \text{[Equation 8]}$$

where A and B are constants.

Using measured values of the DC potential at the substrate $V_{DC}$ from the bias compensation voltage of the chuck and the peak low frequency RF voltage from the applied RF voltage at low frequency $V_{LFRF}$, we find A and B as $$A = \left(\frac{V_{LFRF(PEAK)} - V_{DC}}{2}\right)^{1/2} \quad \text{[Equation 9]}$$

$$B = \left(\frac{V_{LFRF(PEAK)} - V_{DC}}{8}\right)^{1/2} \quad \text{[Equation 10]}$$

Constants A and B can be explained by inserting Equation 9 and Equation 10 into and solving Equation 8. By doing this, we find $$V_{LF}(t) = \frac{V_{LFRF(PEAK)} - V_{DC}}{2} - \frac{V_{LFRF(PEAK)} - V_{DC}}{2}\sin\omega_{LF}t + \frac{V_{LFRF(PEAK)} - V_{DC}}{8}\sin^2\omega_{LF}t \quad \text{[Equation 11]}$$

where the first end the second terms on the right hand side of Equation 11 represent the bias and the amplitude of undistorted sinusoidal waveform of low frequency rf sheath and the third term represent the second harmonic waveform distortion caused by discharge asymmetry and presence of high frequency rf component.

Again, applying Equation 9 and Equation 10 to Equation 8 above, we get $$V_{LF}(t) = \quad \text{[Equation 12]}$$

$$\left[\left(\frac{V_{LFRF(PEAK)} - V_{DC}}{2}\right)^{1/2} - \left(\frac{V_{LFRF(PEAK)} - V_{DC}}{8}\right)^{1/2}\sin\omega t\right]^2$$

Note that Equation 12 is the same as Equation 1 above, which expresses the low frequency sheath voltage $V_{LF}(t)$ as a function of the DC potential at the substrate $V_{DC}$ and the peak low frequency RF voltage $V_{LFRF(PEAK)}$.

By definition, the ion energy distribution function is $$f(E) \equiv \frac{dN}{dE} \quad \text{[Equation 13]}$$

where N is the number of ions, E is the ion energy according to Reference 2 E. Kawamura, V. Vahedi, M. A. Lieberman, and C. K. Birdsall, Plasma Sources Sci. Technol. 8 (1999) R45–R64). As discussed in Reference 2, we can express f(E) as $$f(E) = \frac{dN}{dE} = \frac{dN}{dt}\frac{dt}{dE} = \Gamma_i \frac{dt}{dE} \quad \text{[Equation 14]}$$

where t is time and $\Gamma_i$ is the ion flux entering the sheath. Assuming that $\Gamma_i$ is a constant (according to Reference 2), we find that $$f(E) \equiv \frac{dt}{dE} \quad \text{[Equation 15]}$$

since at low frequency, ions respond to the instantaneous sheath potential, we can assume that the energy of ions coming to the substrate is equal to the sheath potential at the powered electrode and, thus, E equal to $V_{LF}$. From Equations 12 and 15:

$$E = V_{LF} \quad \text{[Equation 16]}$$

Then IEDF at powered electrode can be found from Equation 15 and Equation 16 as $$f(E) \equiv \left(\frac{dV_{LF}}{dt}\right)^{-1} \quad \text{[Equation 17]}$$

Note that this Equation 17 is the same as Equation 2 above, which expresses the ion energy distribution function (IEDF) at the powered electrode as a function of the low frequency sheath voltage $V_{LF}$. The low frequency sheath voltage $V_{LF}$ is in turn expressed as a function of the DC potential at the substrate $V_{DC}$ and the peak low frequency RF voltage $V_{LFRF}$, as shown by Equation 12. Accordingly, an appropriately written software program or specialized electronic circuits can compute the IEDF from the two input parameters: the DC potential at the substrate $V_{DC}$ and the peak low frequency RF voltage $V_{LFRF(PEAK)}$.

The DC potential at the substrate $V_{DC}$ may be also measured directly by the specially designed probe placed on the wafer surface or estimated indirectly by applying complex plasma model with multiple input parameters. The peak low frequency RF voltage $V_{LFRF(PEAK)}$ may be measured by a high voltage probe mounted on the RF feed next to the powered electrode.

IEDF will provide information about minimum, mean, and maximum ion energies, which are critical in determining the etch rate and etch profile anisotropy. Controlling the maximum ion energy may help to reduce ion-induced damage to the substrate.

While this invention has been described in terms of several preferred embodiments, there are alterations, permutations, and equivalents which fall within the scope of this invention. For example, although embodiments of the invention have been discussed in conjunction with a capacitively coupled plasma processing chamber, the invention also applies to inductively-coupled plasma processing chambers (such as Transformer Coupled Plasma or TCP™ plasma processing chambers from Lam Research Corporation of Fremont, Calif.) or electron cyclotron resonance (ECR) plasma processing chambers if a low frequency RF bias is supplied to the substrate. Furthermore, the invention applies to all sinusoidal as well as non-sinusoidal RF waveforms, such as pulsed and/or a tailored waveforms. In view of the inventive techniques and arrangements disclosed herein, one skilled in the art can readily apply the invention to other such periodic signals. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method of approximating an ion energy distribution function (IEDF) at a substrate surface of a substrate, said substrate being processed in a plasma processing chamber, comprising:

providing a first voltage value, said first voltage value representing a value of a first voltage that represents a DC potential ($V_{DC}$) at said substrate surface;

providing a peak low frequency RF voltage value ($V_{LFRF(PEAK)}$) during plasma processing, said peak low frequency RF voltage ($V_{LFRF(PEAK)}$) value representing a peak value of a low frequency RF voltage ($V_{LFRF}$) supplied to said plasma processing chamber;

providing a computing device configured to compute said IEDF from said first voltage value and said peak low frequency RF voltage value ($V_{LFRF(PEAK)}$) in accordance with $$f(E) \equiv \left(\frac{dV_{LF}}{dt}\right)^{-1}$$

wherein $$V_{LF}(t) = \left[\left(\frac{V_{LFRF(PEAK)} - V_{dc}}{2}\right)^{1/2} - \left(\frac{V_{LFRF(PEAK)} - V_{dc}}{8}\right)^{1/2} \sin\omega t\right]^2.$$

2. The method of claim 1 wherein said substrate is disposed on a chuck, said chuck being coupled to a bias compensation circuit, a bias compensation voltage obtained from said bias compensation circuit being employed as said first voltage.

3. The method of claim 2 wherein said chuck is also coupled to a V-I probe that is configured to provide said peak low frequency RF voltage value ($V_{LFRF(PEAK)}$).

4. The method of claim 3 wherein said plasma processing chamber is energized with at least one low frequency RF source operatively coupled to said chuck to provide a low-frequency RF signal to said chuck, a frequency of said low-frequency RF signal corresponding to a frequency of said peak low frequency RF voltage ($V_{LFRF(PEAK)}$).

5. The method of claim 4 wherein said plasma processing chamber is further energized with a high-frequency RF source, said high-frequency RF source providing a high frequency RF signal having a frequency higher than said frequency of said low-frequency RF source.

6. The method of claim 5 wherein said high frequency RF source is operatively coupled to provide said high frequency RF signal to said chuck.

7. The method of claim 5 wherein said high frequency RF source is operatively coupled to provide said high frequency RF signal to an electrode disposed above said substrate.

8. The method of claim 1 wherein said plasma processing chamber represents a capacitively-coupled plasma processing chamber.

9. The method of claim 1 wherein said plasma processing chamber is configured to etch said substrate.

10. The method of claim 1 wherein said first voltage is measured using a probe that contacts said substrate surface during said plasma processing.

11. The method of claim 1 wherein said first voltage is approximated using a multivariate plasma modeling approach.

12. The method of claim 1 wherein said substrate is disposed on a chuck during said plasma processing, said peak low frequency RF voltage ($V_{LFRF(PEAK)}$) is measured using a probe coupled to said chuck.

13. A method of controlling plasma processing in a plasma processing chamber, said plasma processing being configured to process a substrate while said substrate is disposed on a chuck of said plasma processing chamber, comprising:

provifing a first voltage value, said first voltage value representing a value of a first voltage that represents a DC potential ($V_{DC}$) at said substrate surface during plasma processing;

providing a peak low frequency RF voltage value ($V_{LFRF(PEAK)}$) during plasma processing, said peak low frequency RF voltage ($V_{LFRF(PEAK)}$) value representing a peak value of a low frequency RF voltage ($V_{LFRF}$) supplied to said chuck;

providing a computing device configured for computing said IEDF from said first voltage value and said peak low frequency RF voltage value ($V_{LFRF(PEAK)}$) in accordance with $$f(E) \equiv \left(\frac{dV_{LF}}{dt}\right)^{-1}$$

wherein $$V_{LF}(t) = \left[\left(\frac{V_{LFRF(PEAK)} - V_{dc}}{2}\right)^{1/2} - \left(\frac{V_{LFRF(PEAK)} - V_{dc}}{8}\right)^{1/2}\sin\omega t\right]^2;$$

and modifying at least one process parameter associated with a process recipe employed during said plasma processing responsive to a value of said IEDF.

14. The method of claim 13 wherein said chuck is coupled to a bias compensation circuit, a bias compensation voltage obtained from said bias compensation circuit being employed as said first voltage.

15. The method of claim 14 wherein said chuck is also coupled to a V-I probe that is configured to measure said peak low frequency RF voltage value ($V_{LFRF(PEAK)}$).

16. The method of claim 15 wherein said plasma processing chamber is energized with at least one low frequency RF source operatively coupled to said chuck to provide a low-frequency RF signal to said chuck, a frequency of said low-frequency RF signal corresponding to a frequency of said low frequency RF voltage ($V_{LFRF}$).

17. The method of claim 16 wherein said plasma processing chamber is further energized with a high-frequency RF source, said high-frequency RF source providing a high frequency RF signal having a frequency higher than said frequency of said low-frequency RF source.

18. The method of claim 17 wherein said high frequency RF source is operatively coupled to provide said high frequency RF signal to said chuck.

19. The method of claim 17 wherein said high frequency RF source is operatively coupled to provide said high frequency RF signal to an electrode disposed above said substrate.

20. The method of claim 13 wherein said plasma processing chamber represents a capacitively-coupled plasma processing chamber.

21. The method of claim 13 wherein said plasma processing chamber is configured to etch said substrate.

22. The method of claim 13 wherein said providing a first voltage value and said providing said peak low frequency RF voltage value ($V_{LFRF(PEAK)}$) are performed on a continuous basis.

23. The method of claim 13 wherein said providing a first voltage value and said providing said peak low frequency RF voltage value ($V_{LFRF(PEAK)}$) are performed on a periodic basis.

24. The method of claim 13 wherein said first voltage is measured using a probe that contacts said substrate surface during said plasma processing.

25. The method of claim 13 wherein said first voltage is approximated using a multivariate plasma modeling approach.

26. The method of claim 13 wherein said peak low frequency RF voltage ($V_{LFRF(PEAK)}$) is measured using a probe coupled to said chuck.

27. An arrangement for approximating an ion energy distribution function (IEDF) at a substrate surface of a substrate, said substrate being processed in a plasma processing chamber, comprising:

a first circuit for obtaining a first voltage value, said first voltage value representing a value of a first voltage that represents a DC potential ($V_{DC}$) at said substrate surface;

a second circuit for obtaining a peak low frequency RF voltage value ($V_{LFRF(PEAK)}$) during plasma processing, said peak low frequency RF voltage ($V_{LFRF(PEAK)}$) value representing a peak value of a low frequency RF voltage ($V_{LFRF}$) supplied to said plasma processing chamber;

a computing device configured to compute said IEDF from said first voltage value and said peak low frequency RF voltage ($V_{LFRF(PEAK)}$) in accordance with $$f(E) \equiv \left(\frac{dV_{LF}}{dt}\right)^{-1}$$

wherein $$V_{LF}(t) = \left[\left(\frac{V_{LFRF(PEAK)} - V_{dc}}{2}\right)^{1/2} - \left(\frac{V_{LFRF(PEAK)} - V_{dc}}{8}\right)^{1/2}\sin\omega t\right]^2.$$

28. The arrangement of claim 27 wherein said substrate is disposed on a chuck, said chuck being coupled to a bias compensation circuit, a bias compensation voltage obtained from said bias compensation circuit being employed as said first voltage.

29. The arrangement of claim 28 wherein said chuck is also coupled to a V-I probe that is configured to provide said peak low frequency RF voltage ($V_{LFRF(PEAK)}$).

30. The arrangement of claim 29 wherein said plasma processing chamber is energized with at least one low frequency RF source operatively coupled to said chuck to provide a low-frequency RF signal to said chuck, a frequency of said low-frequency RF signal corresponding to a frequency of said peak low frequency RF voltage ($V_{LFRF(PEAK)}$).

31. The arrangement of claim 30 wherein said plasma processing chamber is further energized with a high-frequency RF source, said high-frequency RF source providing a high frequency RF signal having a frequency higher than said frequency of said low-frequency RF source.

32. The arrangement of claim 31 wherein said high frequency RF source is operatively coupled to provide said high frequency RF signal to said chuck.

33. The arrangement of claim 31 wherein said high frequency RF source is operatively coupled to provide said high frequency RF signal to an electrode disposed above said substrate.

34. The arrangement of claim 27 wherein said plasma processing chamber represents a capacitively-coupled plasma processing chamber.

35. The arrangement of claim 27 wherein said plasma processing chamber is configured to etch said substrate.

36. The arrangement of claim 27 wherein said first voltage is measured using a probe that contacts said substrate surface during said plasma processing.

37. The arrangement of claim 27 wherein said first voltage is approximated using a multivariate plasma modeling approach.

38. The arrangement of claim 27 wherein said substrate is disposed on a chuck during said plasma processing, said peak low frequency RF voltage ($V_{LFRF(PEAK)}$) is measured using a probe coupled to said chuck.

39. The arrangement of claim 27 wherein said peak low frequency RF voltage value ($V_{LFRF(PEAK)}$) is associated with a periodic, non-sinusoidal RF signal.

40. The arrangement of claim 39 wherein said peak low frequency RF voltage value ($V_{LFRF(PEAK)}$) is associated with a pulsed RF signal.

41. The arrangement of claim 39 wherein said peak low frequency RF voltage value ($V_{LFRF(PEAK)}$) is associated with a tailored-waveform RF signal.

* * * * *